Figure 1:
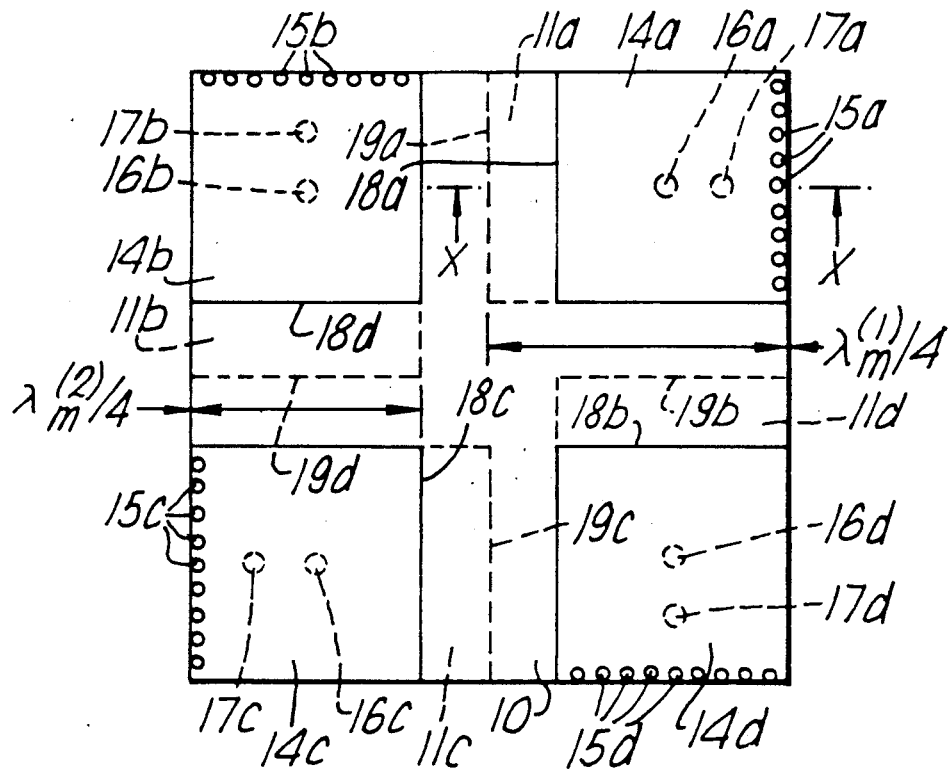

United States Patent [19]

Sullivan et al.

[11] Patent Number: 5,050,295
[45] Date of Patent: Sep. 24, 1991

[54] MULTILAYER THROUGH HOLE CONNECTIONS

[75] Inventors: Melvyn Sullivan, Sawbridgeworth; John A. Durban, Epping; Peter D. Stanier, Harlow; Robert E. J. Edwards, Waltham Abbey, all of United Kingdom

[73] Assignee: STC PLC, London, England

[21] Appl. No.: 596,380

[22] Filed: Oct. 12, 1990

[30] Foreign Application Priority Data

Oct. 14, 1989 [GB] United Kingdom ............... 8923213

[51] Int. Cl.$^5$ ............................................. H05K 1/02
[52] U.S. Cl. .................................... 29/830; 174/266
[58] Field of Search .............. 439/74, 75, 84; 29/830, 29/845; 174/262, 264, 266

[56] References Cited

U.S. PATENT DOCUMENTS

| | | | |
|---|---|---|---|
| 2,938,068 | 5/1960 | Silverschotz | 174/266 |
| 4,070,077 | 1/1978 | Clark . | |
| 4,562,301 | 12/1985 | Kameda et al. | 29/845 |
| 4,889,496 | 12/1989 | Neidich | 439/81 |

FOREIGN PATENT DOCUMENTS

| | | |
|---|---|---|
| 1086093 | 10/1967 | United Kingdom . |
| 2005085 | 4/1979 | United Kingdom . |
| 2047974 | 12/1980 | United Kingdom . |

Primary Examiner—Neil Abrams
Attorney, Agent, or Firm—Lee, Mann, Smith, McWilliams & Sweeney

[57] ABSTRACT

A method of providing a through-hole connection between conductive layers of a multilayer circuit board assembly whose thickness is liable to expansion and contraction is described. The method includes inserting into through-holes in adjacent boards a tubular flexible conductive member and expanding that member in a position intermediate its ends to engage the through-holes. The boards are then urged together to further expand the tubular member so as to retain that member in the through-holes. Typically the conductive member comprises a tubular braid.

5 Claims, 4 Drawing Sheets

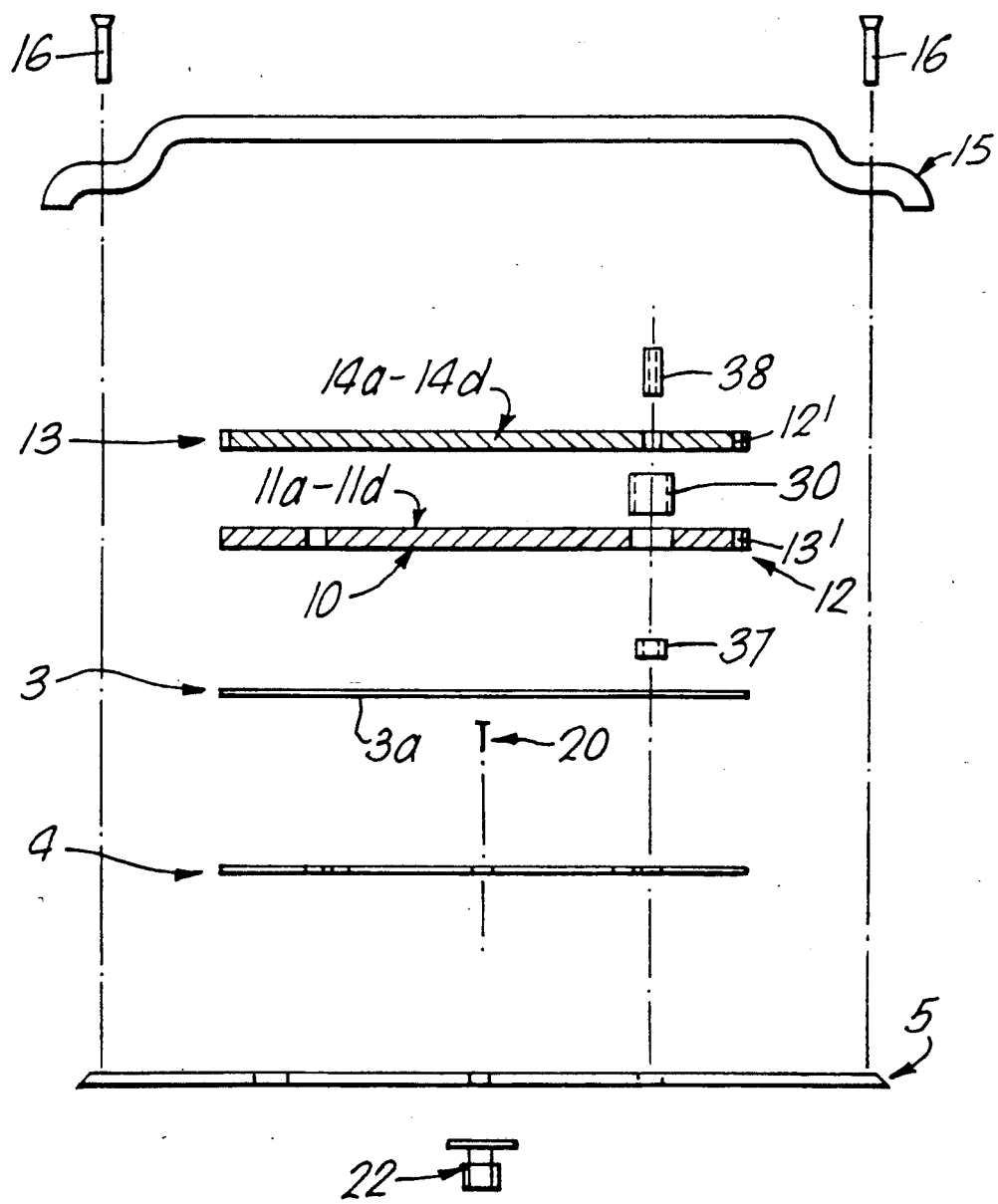

MULTILAYER THROUGH HOLE CONNECTIONS

This invention relates to an interconnection technique for through holes in multilayer boards, particularly though not exclusively to such boards used in a receiver antenna.

Multilayer boards with plated-through holes are known. The through hole is conventionally plated with copper by an electroless plating technique well known in the industry, to form an interconnection between the various conductive layers in the assembled boards.

We have found however that if the boards are liable to expand or contract in thickness due to for example a large temperature coefficient of linear expansion in that direction then discontinuities can occur in the plated holes.

One known solution to the problem is the 'C-link'. This comprises a C-shaped metal link which is connected to the top and bottom layers and which flexes with thickness change of the boards, but cannot be connected to an intermediate layer without a platform within the hole to solder an intermediate portion of the link and so its use is restricted either to those application where an intermediate connection is not required or to a more elaborate platformed arrangement for intermediate connection. Also good accessibility is required and this is not always available and for some applications the impedance is too high and too variable.

Another solution is the so-called "fuzzball". This comprises a ball of fine wire compressed into the through hole. For connection to the outer layer end caps are required covering the ends of the hole. This is a complication, and the resistance is lower than the C-link but a lower resistance still would be preferable for some applications.

GB patent 1086093 discloses a technique for connecting between terminal circuit elements using a flexible electrical conductor on a resilient central member. This overcomes the problem of expansion and contraction in the thickness of the printed circuit boards, but does not enable connection to an intermediate circuit element.

It is an object of the present invention to provide a simple solution to the problem of intermediate connection which is easy to manufacture, cheap and effective.

According to the present invention there is provided a through-hole connection in a multilayer board assembly whose thickness is liable to change significantly in use thereof, said connection comprising a hollow tubular flexible electrically conductive member connected to three conductive layers of said assembly, the conductive member having an expanded region at a location intermediate its ends and connected to an intermediate one of said layers at its expanded region.

According to another aspect of the present invention there is provided a method of making a through hole connection between three conductive layers of a multilayer board whose thickness is liable to expansion and contraction, comprising assembling at least two boards together with through holes or channels aligned, inserting a tubular flexible conductive member which fits in the holes, expanding the member at a location intermediate its ends and connecting the expanded region to an intermediate one of said layers.

Figure 2:
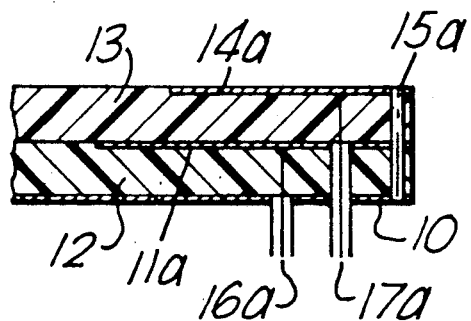
Figure 4A:
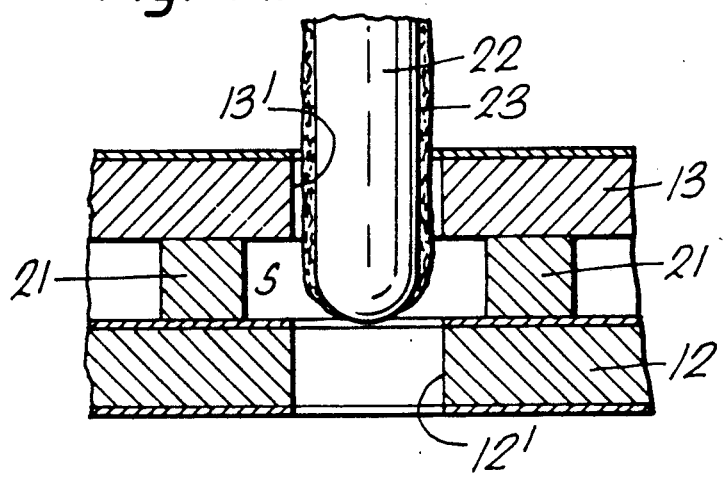
Figure 4B:
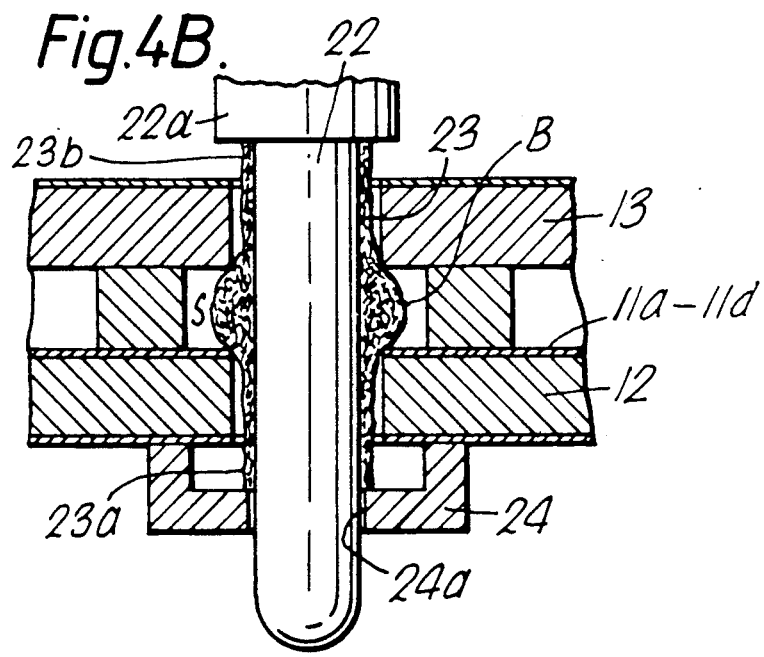
Figure 4C:
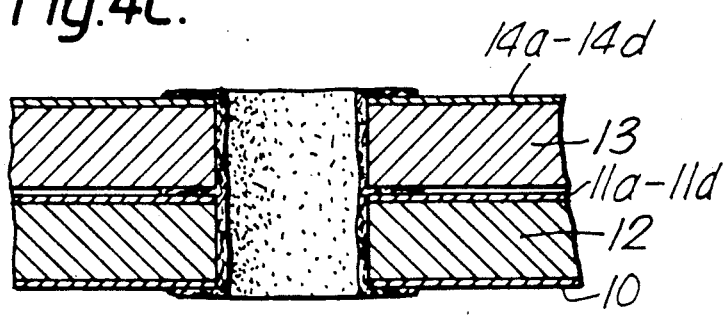

Embodiments of the invention will now be described with reference to the accompanying drawings, in which:

FIG. 1 is a plan view of a dual band circularly polarised antenna according to an embodiment of the invention, FIG. 2 is a cross-sectional elevation on the line XX of FIG. 1, FIG. 3 shows an exploded view of the component parts of FIGS. 1 and 2, along with the rest of the antenna FIGS. 4A, 4B and 4C show three steps on the formation of a through-hole connection used in making the antenna of FIGS. 1 to 3, and FIG. 5 shows a through-hole connection also used in the antenna of FIGS. 1 to 3, according to another embodiment of the invention.

Figure 5:
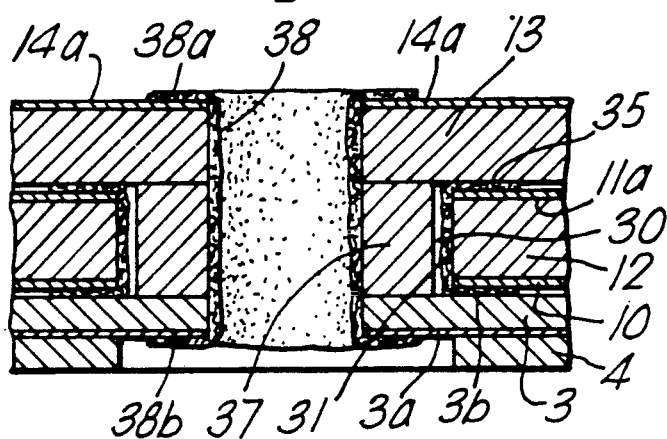
Figure 6:
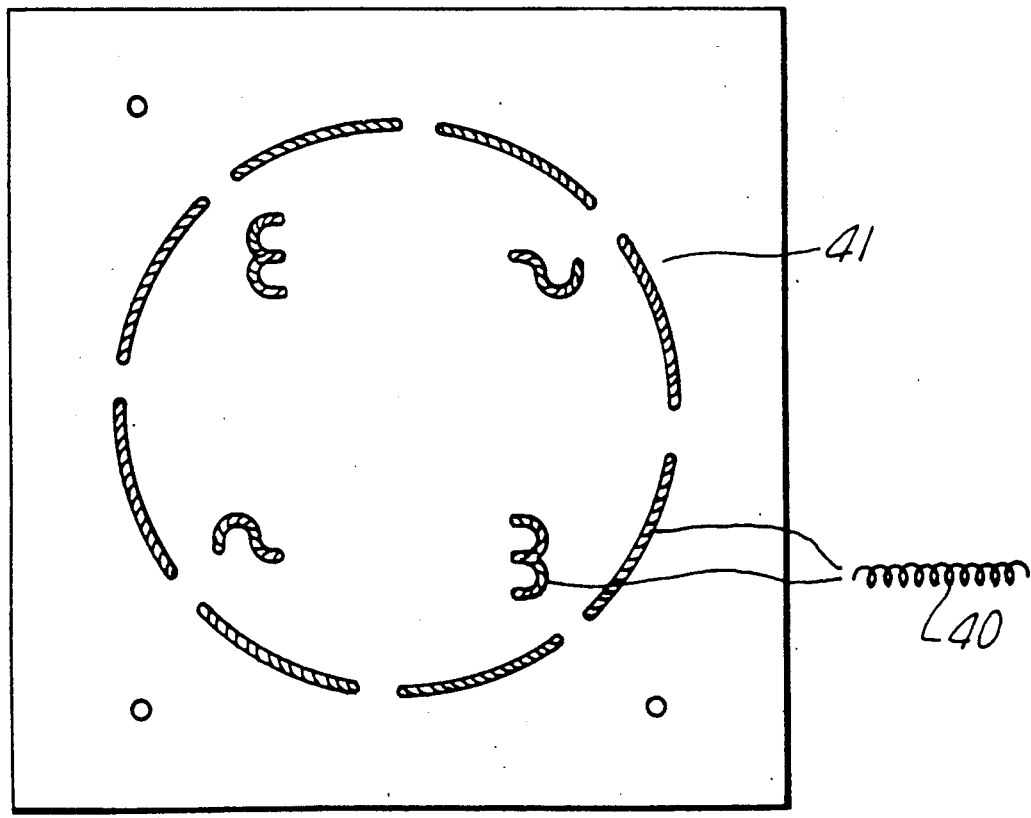

FIG. 6 shows two of the boards of the antenna of FIGS. 1-5.

The dual band antenna illustrated comprises two crossed slot antenna superimposed on a common ground plane 10. FIG. 1 is somewhat schematic and ground plane 10 is a cladding under board 12 (FIG. 2). The first crossed slot antenna layer is formed of a set of four patches 11a–11d having effective lengths $\lambda_o^{(1)}/4$ arranged in rotation so that their radiating edges form the crossed slot structure. The patches 11a–11d are formed by etching copper cladding carried on one face of a sheet 12 of dielectric material the other face of which carries the common ground plane as a copper cladding 10. Superimposed on the first antenna layer is a second crossed slot antenna layer formed of a second dielectric sheet 13 carrying a second set of four patches 14a–14d, aligned with the etched first set of patches. The patches 14a–14d are also formed by etched copper cladding on the upper face and each have an effective length of $\lambda_o^{(2)}/4$. where $\lambda_o^{(1)}$ is greater than $\lambda_o^{(2)}$. Each superimposed pair of patches e.g. 11a, 14a are shorted to the ground plane 10 by a common set of shorting links e.g. 15a. The patches of the first set are fed by respective coaxial feeds 16a–16d, the outer conductors of which are connected to the ground plane. The patches of the second set are fed by respective coaxial feeds 17a–17d, the outer conductors of which pass through the ground plane and are connected to both the ground plane and the patches of the first set. It is to be noted that the patches 11a–11d are larger than patches 14a–14d so that the radiating edges of each stacked pair of patches e.g. 11a and 14a are arranged so that the top patch 14a does not obstruct the radiation from the bottom patch 11a. The antenna structure support sheets 12 and 13 are assembled onto a conducting base plate 5 as shown in FIG. 3. In between the ground plane 10 and the base plate 5 are two dielectric substrates 3 and 4 which carry interconnections between a coaxial signal output connector 22 and the coaxial feeds 16a–16d and 17a–17d.

Substrate 3 has copper cladding 3a on its lower side which has been etched to provide interconnecting tracks between the male pin 20 of connector 22 and the longer male centre conductor 38 formed of swollen tubular braid of coaxial feed-throughs 16a–16d (see FIG. 5).

The sheets 12 and 13 are made of a dielectric material having a low dielectric constant and the thickness is about 3.2 mm. The material also has a high temperature coefficient of expansion in the direction of its thickness and conventional through hole connections for the shorting links etcetera are not satisfactory as explained in the preamble.

FIG. 4 shows an embodiment of a through hole connection suitable for the antenna described, particularly the shorting links 15a to 15d.

As boards 12, 13 are assembled they are held spaced apart by a temporary spacer 21.

Through holes 13' and 12' are aligned:

A mandrel 22 having a tubular flexible conductive link 23 formed of a conductive braid supported thereon is inserted through the holes 13', 12' from above board 13, as shown in FIG. 4A.

The mandrel 22 is inserted further as shown in FIG. 4B and enters a stop member 24 held by a jig against the underside of board 12. The stop member has a hole 24a which is a sliding fit around mandrel 23. Mandrel 23 has a shoulder 22a and the length of the flexible tubular link 23 is such that when fully inserted a predetermined amount, the shoulder and the stop member co-operate to compress link 23 along its longitudinal axis, causing an expanded region "B" of the link at its mid-portion intermediate its ends where the space "S" between the boards caused by the spacer defines where this bellying is allowed to occur.

The spacer 21 is removed and the boards 12 and 13 compressed together thus flattening the bellied portion into a radial flange-like portion and trapping it between the boards and connecting the expanded region B to intermediate conductive layer 11a–11d, as well as to ground plane 10 and batches 14a–14d.

The mandrel 23 and the stop 24 are removed and the projecting end portions 23a and 23b are belled over prior to fusing the boards together.

This provides a shorting link such as 15a in FIGS. 1 to 3. A set of such links is required for each pair of superimposed patches such as 15a for patches 11a and 14a, 15b for patches 11b, 14b, and so on.

Alternatively the braids can be preformed.

Another embodiment of the invention is shown in FIG. 5. Here a tubular flexible conductor 30 made also of copper braid has been inserted in a through hole 31 in the copper clad board 12 having the cladding 11a forming one of the patches and the ground plane 10. It has been belled over onto the claddings at 35 and 36 and soldered to the claddings.

The board 12 is then assembled with boards 13 having the cladding 14a (one of the patches) on its upper side only, and substrates 3 and 4, as described earlier, with a rigid insulating sleeve 37 inserted in the conductor 30.

A swollen-diameter flexible tubular conductive braid 38 is soldered to patch 14a at 38a and to distribution conductor 3a at 38B This arrangement forms a coaxial feed between patch 14a and the distribution conductor 3a to connect with the connector 22.

Then the antenna is completed by bonding the four boards 12, 13, 3, 4, to the baseplate 5 fitting connector 20, 22, and securing cover 15 with rivets 16 to conductive base 5.

In order to prevent leakage or crosstalk, a screening arrangement is provided. FIG. 6 shows boards 3 and 4 in plan view. Several through channels have been formed around the various feed-throughs forming E-shaped and question-mark shaped channels. In these channels are located elongated beryllium copper springs. When, the four boards are bonded to the baseplate these springs become compressed transversely of their longitudinal axes to form conductive screens around the feed-throughs. Also a circular surrounding screen 41 is formed by eight channels centering similar springs 40. The springs provide a short circuit path between the cladding 10 under board 12 and the conductive base plate 5.

In both the embodiments described we have found that the flexible tubular conductors 31 in FIG. 5 and 23 in FIG. 4 in conjuction with the flexible central tubular conductor 38 of the coaxial feed of FIG. 5, accommodates expansion and contraction of the boards 12 and 13, and substrate 3, without discontinuities forming. Braids forming inner co-axial connections 16a–16d also withstand expansion and contraction of substrates 12 and 13. Furthermore these links are easy to make and show low impedances e.g. 3 mΩ which are regularly reproducible.

In the example illustrated, the difference between frequency $f_1$ and $f_2$ is 30% approximately, where $f_2$ is higher than $f_1$.

In this embodiment sheets 12 and 13 have the same dielectric constants although sheets of different dielectric constant could be used to alter the relative patch lengths involved approximately equal to:

$$\lambda_o^{(1)}/4 \sqrt{\epsilon 1} \text{ and } \lambda_o^{(2)}/4 \sqrt{\epsilon 2}$$

The lateral dimensions of the antenna are governed by $\lambda_o^{(1)}$, the larger wavelength, and $\epsilon_r$, the dielectric constant of sheets 12 and 13.

Whilst the particular embodiment described utilises a cross slot structure it will be appreciated that other multiple patch antenna structures can also be constructed in a superimposed arrangement utilising the links described in FIGS. 4 and 5.

We claim:

1. A method of making a through-hole connection between conductive layers of a multilayer circuit board assembly whose thickness is liable to expansion and contraction, the method comprising assembling at least two boards in an adjacent configuration with through-holes or channels aligned, inserting a tubular flexible conductive member into the holes or channels, expanding said conductive member at a location intermediate its ends whereby to engage the through-holes or channels and to contact an intermediate one of said conductive layers, and urging said boards together so as to further expand the flexible member whereby to retain the expanded portion of the tubular member in said holes or channels.

2. A method as claimed in claim 1, said conductive member comprising a braid.

3. A method as claimed in claim 1, and the assembly further comprising a helical spring compressed transversely of its longitudinal axis between conductive layers to form a shaped interconnection.

4. A method as claimed in claim 1, wherein said multilayer board assembly comprises a microstrip antenna.

5. A method of making a through-hole connection between conductive layers of a multilayer circuit board assembly whose thickness is liable to expansion and contraction, the method comprising assembling at least two boards in a closely spaced configuration with through-holes or channels aligned, the distance between the boards being defined by a spacing member, inserting a flexible conductive member comprising a tubular braid into the holes or channels, said conductive member being longer than the distance between the outer surfaces of said board, axially comprising the tubular member to a length corresponding to said distance whereby to expand the conductive member at a location intermediate its ends so as to engage the through-holes or channels and to contact an intermediate one of said conductive layers, removing said spacing member, and urging said boards together so as to further expand the conductive member and trap a portion of the expanded member between said boards.

* * * * *